United States Patent
Ogihara

(10) Patent No.: US 11,798,805 B2
(45) Date of Patent: Oct. 24, 2023

(54) METHOD FOR MANUFACTURING SEMICONDUCTOR DEVICE AND SEMICONDUCTOR SUBSTRATE

(71) Applicant: FILNEX INC., Tokyo (JP)

(72) Inventor: Mitsuhiko Ogihara, Tokyo (JP)

(73) Assignee: Filnex Inc., Tokyo (JP)

( * ) Notice: Subject to any disclaimer, the term of this patent is extended or adjusted under 35 U.S.C. 154(b) by 295 days.

(21) Appl. No.: 17/211,871

(22) Filed: Mar. 25, 2021

(65) Prior Publication Data

US 2021/0210344 A1 Jul. 8, 2021

Related U.S. Application Data

(63) Continuation of application No. PCT/JP2019/032217, filed on Aug. 19, 2019.

(30) Foreign Application Priority Data

Oct. 2, 2018 (JP) .................. 2018-187286

(51) Int. Cl.
  *H01L 21/02* (2006.01)
  *H01L 21/683* (2006.01)
  *H01L 21/78* (2006.01)

(52) U.S. Cl.
  CPC .... *H01L 21/02444* (2013.01); *H01L 21/6835* (2013.01); *H01L 21/7806* (2013.01)

(58) Field of Classification Search
  CPC ........... H01L 21/02444; H01L 21/6835; H01L 21/7806; H01L 2221/68354
  (Continued)

(56) References Cited

U.S. PATENT DOCUMENTS 7,208,337 B2 * 4/2007 Eisert .................. H01L 33/20
  438/455
8,409,366 B2 * 4/2013 Ogihara ............ H01L 21/02612
  257/613
(Continued)

FOREIGN PATENT DOCUMENTS

CN 106816512 6/2017
CN 108140552 6/2018
(Continued)

OTHER PUBLICATIONS

"International Search Report (Form PCT/ISA/210) of PCT/JP2019/032217," dated Oct. 1, 2019, with English translation thereof, pp. 1-5.

(Continued)

*Primary Examiner* — Vu A Vu
(74) *Attorney, Agent, or Firm* — JCIPRNET

(57) ABSTRACT

A method for manufacturing a semiconductor device and a semiconductor substrate are provided. A method for manufacturing a semiconductor device includes the steps of forming a bonding layer that bonds a semiconductor thin film to a bonding layer region on a portion of a first substrate with a force weaker than covalent bonding, forming the semiconductor thin film in the bonding layer region and a non-bonding layer region other than the bonding layer region, separating the semiconductor thin film from the first substrate by bonding an organic layer included in a pick-up substrate different from the first substrate to the semiconductor thin film, removing the bonding layer adhered to a peeled surface of the semiconductor thin film separated from the first substrate, and bonding the semiconductor thin film from which the bonding layer has been removed to a second substrate different from the first substrate.

9 Claims, 9 Drawing Sheets

(58) Field of Classification Search
USPC .......................................................... 438/460
See application file for complete search history.

(56) References Cited

U.S. PATENT DOCUMENTS

| | | | |
|---|---|---|---|
| 8,664,086 B2* | 3/2014 | Ogihara | H01L 21/02381 |
| | | | 257/77 |
| 8,835,940 B2* | 9/2014 | Hu | H01L 24/93 |
| | | | 257/79 |
| 8,934,259 B2* | 1/2015 | Bower | H01L 21/563 |
| | | | 430/48 |
| 9,209,348 B2* | 12/2015 | Hu | H01L 33/62 |
| 9,217,541 B2* | 12/2015 | Bathurst | H01L 21/7806 |
| 9,368,683 B1* | 6/2016 | Meitl | H01L 33/62 |
| 9,450,147 B2* | 9/2016 | McGroddy | H01L 33/145 |
| 9,554,484 B2* | 1/2017 | Rogers | H05K 1/189 |
| 9,633,982 B2* | 4/2017 | Chang | H01L 25/0753 |
| 9,773,711 B2* | 9/2017 | Wu | H01L 24/81 |
| 9,887,180 B2* | 2/2018 | Meitl | H01L 33/0095 |
| 10,395,966 B2* | 8/2019 | Bower | B65G 47/91 |
| 11,062,936 B1* | 7/2021 | Moore | H01L 21/68764 |
| 11,088,297 B2* | 8/2021 | Höppel | H01L 33/50 |
| 11,233,038 B2* | 1/2022 | Feng | H01L 24/83 |
| 2010/0270562 A1 | 10/2010 | Ogihara | |
| 2010/0320445 A1 | 12/2010 | Ogihara et al. | |
| 2014/0220764 A1 | 8/2014 | Bayram et al. | |
| 2018/0197736 A1 | 7/2018 | Kim | |
| 2021/0175220 A1* | 6/2021 | Feng | H01L 24/83 |
| 2021/0358792 A1* | 11/2021 | Wagner | H01L 33/22 |

FOREIGN PATENT DOCUMENTS

| | | |
|---|---|---|
| JP | 2010258352 | 11/2010 |
| JP | 2011009268 | 1/2011 |
| JP | 5070247 | 11/2012 |
| JP | 2015015321 | 1/2015 |

OTHER PUBLICATIONS

"Written Opinion of the International Searching Authority (Form PCT/ISA/237) of PCT/JP2019/032217," dated Oct. 1, 2019, with English translation thereof, pp. 1-7.

* cited by examiner

METHOD FOR MANUFACTURING SEMICONDUCTOR DEVICE AND SEMICONDUCTOR SUBSTRATE

CROSS-REFERENCE TO RELATED APPLICATIONS

The present application is a continuation application of International Application number PCT/JP2019/032217, filed on Aug. 19, 2019, which claims priority under 35 U.S.C. § 119(a) to Japanese Patent Application No. 2018-187286, filed on Oct. 2, 2018. The contents of this application are incorporated herein by reference in their entirety.

BACKGROUND

The present invention relates to a method for manufacturing a semiconductor device and a semiconductor substrate. There is conventionally a known technique of detaching a semiconductor epitaxial layer from a base material substrate and transferring the detached semiconductor epitaxial layer to another substrate. Japanese Patent No. 5070247 discloses a process of forming a nitride semiconductor layer on a graphene layer formed on a base substrate, and then peeling off the nitride semiconductor layer from the base substrate.

In the prior art, a nitride semiconductor thin film is bonded to a base substrate through a graphene layer by, for example, a weak Van der Waals force. Therefore, if the film stress of the nitride semiconductor thin film becomes larger along with a change such as the film thickness of the nitride semiconductor thin film being increased, while the semiconductor thin film is crystal grown on a SiC substrate, the nitride semiconductor thin film may be unintentionally peeled off from the base substrate. Further, there have been cases where the nitride semiconductor thin film is unintentionally peeled off from the base substrate even in a step of processing such as device forming and device separating by processing the nitride semiconductor thin film layer.

SUMMARY

The present invention has been made in view of these points and provides a method for manufacturing a semiconductor device and a semiconductor substrate in which a semiconductor thin film formed on a base substrate is not easily peeled off unintentionally.

A method for manufacturing a semiconductor device in the first embodiment of the present invention includes the steps of forming a bonding layer that bonds a semiconductor thin film to a bonding layer region on a portion of a first substrate with a force weaker than covalent bonding, forming the semiconductor thin film in the bonding layer region and a non-bonding layer region other than the bonding layer region, separating the semiconductor thin film from the first substrate by bonding an organic layer included in a separation substrate different from the first substrate to the semiconductor thin film, removing the bonding layer adhered to a peeled surface of the semiconductor thin film separated from the first substrate, and bonding the semiconductor thin film from which the bonding layer has been removed to a second substrate different from the first substrate.

A method for manufacturing a semiconductor device in the second embodiment of the present invention includes steps of forming a bonding layer that bonds a semiconductor thin film to a bonding layer region on a portion of a first substrate with a force weaker than covalent bonding, forming the semiconductor thin film in the bonding layer region, forming a fixing layer extending from the semiconductor thin film to a region where the semiconductor thin film is not formed, separating the semiconductor thin film from the first substrate by bonding an organic layer included in a separation substrate different from the first substrate to the semiconductor thin film, removing the bonding layer adhered to a peeled surface of the semiconductor thin film separated from the first substrate, and bonding the semiconductor thin film from which the bonding layer has been removed to a second substrate different from the first substrate.

A semiconductor substrate in the third embodiment of the present invention includes a base substrate, a bonding layer formed in a bonding layer region on a portion of the base substrate, and a semiconductor thin film formed a) on a bonding layer formed in the bonding layer region and b) on the base substrate in the non-bonding layer region other than the bonding layer region, wherein the bonding layer bonds a semiconductor thin film with a force weaker than covalent bonding. A semiconductor substrate in the fourth embodiment of the present invention includes a base substrate, a bonding layer formed in a bonding layer region of a portion of the base substrate, a semiconductor thin film formed on a bonding layer formed in the bonding layer region, and a fixing layer extending from the semiconductor thin film to a non-bonding layer region other than the bonding layer region, wherein the bonding layer bonds the semiconductor thin film with a force weaker than covalent bonding.

DETAILED DESCRIPTION OF THE INVENTION

Hereinafter, the present invention will be described through exemplary embodiments of the present invention, but the following exemplary embodiments do not limit the invention according to the claims, and not all of the combinations of features described in the exemplary embodiments are necessarily essential to the solution means of the invention.

<Configuration of the Semiconductor Substrate 100>

Figure 1:
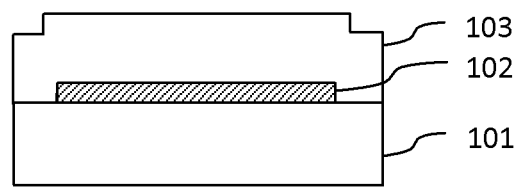
FIG. 1 shows an outline of a configuration of a semiconductor substrate for manufacturing a semiconductor device of the present embodiment.

FIG. 1 shows an outline of a configuration of a semiconductor substrate 100 for manufacturing a semiconductor device of the present embodiment. The semiconductor substrate 100 includes a first substrate 101 serving as a base substrate, a bonding layer 102, and a semiconductor thin film 103. The semiconductor thin film 103 is formed above the first substrate 101 through the bonding layer 102. The bonding layer 102 is a layer for bonding the semiconductor thin film 103 and the first substrate 101 with a bonding force weaker than covalent bonding. The bonding force weaker than covalent bond is, for example, a Van der Waals force.

The material constituting the bonding layer 102 has, for example, a structure in which layers where carbon atoms are arranged in two dimensions are stacked. Since such a stacked structure is not covalently bonded to other layers, the bonding layer 102 is bonded to the first substrate 101 by a weak Van der Waals force. The bonding layer 102 may include, for example, at least a graphene layer. The material of the first substrate 101 is, for example, SiC. By heating the first substrate 101, which is a SiC substrate, to a high temperature, a graphene layer serving as the bonding layer 102 can be formed on the surface of the first substrate 101.

In addition to the SiC substrate, the first substrate 101 may be, for example, i) a Si substrate, ii) a group III-V compound semiconductor substrate such as a GaAs substrate, an InP substrate or a GaN substrate, iii) an oxide substrate such as a sapphire substrate (an $Al_2O_3$ substrate), a $Ga_2O_3$ substrate or a ZnO substrate, or iv) a nitride substrate such as an AlN substrate or a SiN substrate. Further, one or more graphene layers may be adhered to the surface of the first substrate 101 as the bonding layer 102. The material of the first substrate 101 can be selected from materials suitable for crystal growth of the semiconductor thin film 103 on the basis of properties such as lattice constants, crystal systems, or thermal properties of the material of the semiconductor thin film 103 provided above the first substrate 101.

The material of the semiconductor thin film 103 is a nitride semiconductor, for example, $In_xGa_{1-x}N$ ($0 \leq x \leq 1$), $Al_xGa_{1-x}N$ ($0 \leq x \leq 1$), or the like. The semiconductor thin film 103 may be a group III-V compound semiconductor such as $Al_xGa_{1-x}As$ ($0 \leq x \leq 1$), $Al_xGa_yIn_{1-x-y}P$ ($0 \leq x \leq 1$, $0 \leq y \leq 1$), $GaAs_xP_{1-x}$ ($0 \leq x \leq 1$), $In_xGa_{1-x}As_yP_{1-y}$ ($0 \leq x \leq 1$, $0 \leq y \leq 1$), or the like, and may be a semiconductor including Si such as Si, SiGe, or the like. The semiconductor thin film 103 may be a semiconductor layer crystal grown on the bonding layer 102 above the first substrate 101.

The semiconductor thin film 103 may be formed of a single layer of the above-mentioned semiconductor material, or a stack of a plurality of layers including the above-mentioned semiconductor material. A crystal growing method of the semiconductor thin film 103 can be selected from crystal growing methods such as a Metal Organic Chemical Vapor Deposition method (MOCVD), a Molecular Beam Epitaxy method (MBE), a Chemical Vapor Deposition method (CVD), a laser ablation method, or a mist-growth method. The crystal growing method of the semiconductor thin film 103 may be appropriately selected in accordance with a semiconductor material constituting the semiconductor thin film 103, a stacked structure of the semiconductor thin film, or the like.

When the semiconductor thin film 103 is crystal-grown above the first substrate 101 through the bonding layer 102, the magnitude of the film stress of the semiconductor thin film 103 depends on various conditions such as the material, the layer structure, the layer thickness, and the crystal growth temperature of the semiconductor thin film 103. When the film stress of the semiconductor thin film 103 becomes larger than the bonding force between the layers constituting the bonding layer 102 (e.g., the bonding force between the graphene layers constituting the bonding layer 102), the semiconductor thin film 103 may be unintentionally peeled off from the first substrate 101 in a semiconductor device manufacturing process such as a crystal growth process of the semiconductor thin film 103 or a process of forming a semiconductor device structure in the semiconductor thin film 103. According to the semiconductor substrate used in the semiconductor manufacturing method of the present embodiment, it is possible to reduce the risk that the semiconductor thin film 103 is unintentionally peeled off.

Figure 2A:
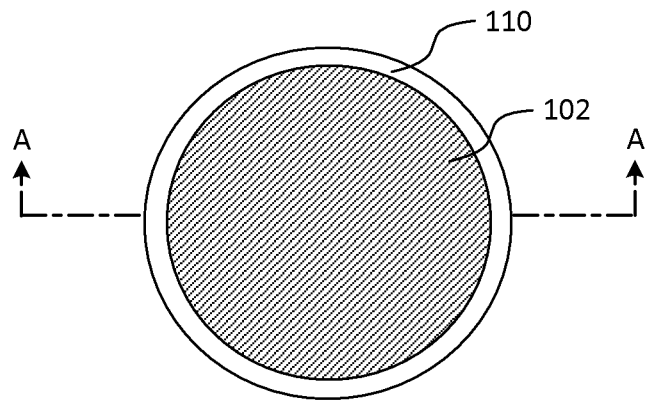
FIGS. 2A to 2C show a structure of the semiconductor substrate used in the method for manufacturing the semiconductor of the present embodiment.
Figure 2B:
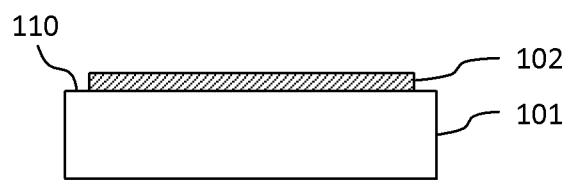
Figure 2C:
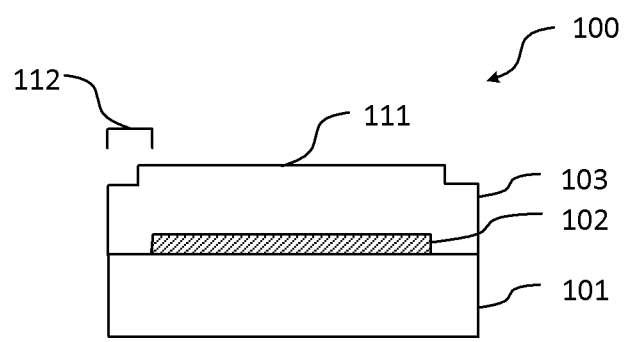

FIGS. 2A to 2C show a structure of the semiconductor substrate 100 used in the semiconductor manufacturing method of the present embodiment. FIG. 2A and FIG. 2B show an overhead view and a cross section of a semiconductor structure in the process of manufacturing a semiconductor substrate 100 shown in FIG. 2C.

The semiconductor substrate 100 shown in FIG. 2C includes a first substrate 101, a bonding layer 102 formed in a bonding layer region on a portion of the first substrate 101, and a semiconductor thin film 103 formed (i) on the bonding layer 102 formed on the bonding layer region and (ii) on the first substrate 101 corresponding to a non-bonding layer region other than the bonding layer region. The bonding layer region is a region where the bonding layer 102 is formed.

FIG. 2A shows a top view of the semiconductor structure with the bonding layer 102 formed above the first substrate 101. FIG. 2B shows an A-A line cross section. Although the first substrate 101 shown in FIGS. 2A to 2C is circular, the first substrate 101 may have any shape other than a circular shape, for example, a rectangular shape. As shown in FIG. 2A, the area of the bonding layer 102 is smaller than the area of the first substrate 101, and the bonding layer 102 is formed so that the outer periphery of the bonding layer 102 is smaller than the outer periphery of the first substrate 101. Further, between the outer periphery of the first substrate 101 and the outer periphery of the bonding layer 102, an exposed region 110 in which the first substrate 101 is exposed is formed.

The semiconductor structure shown in FIG. 2A can be manufactured by, for example, the following steps. First, the bonding layer 102 is formed on the entire surface of the first substrate 101. Next, the bonding layer 102 in a partial region (a region corresponding to the exposed region 110) on the first substrate 101 is removed by dry etching (dry etching using gas such as $O_2$) while masking a region where the bonding layer 102 is to remain by using a resist mask, a metal mask, or the like, formed by a typical photolithography method. In a case where step using a photolithography is adopted, the resist mask is removed after removing the bonding layer 102 in a partial region on the first substrate 101, and a step of removing the bonding layer 102 in the partial region on the first substrate 101 is completed.

FIG. 2C shows a cross section of the semiconductor substrate 100 on which the semiconductor thin film 103 was crystal-grown, after the step of manufacturing the semiconductor structure shown in FIG. 2A. In FIG. 2C, the non-bonding layer region 112 is a region in which the semiconductor thin film 103 is crystal-grown on the exposed region 110 obtained by removing the bonding layer 102 on the first substrate 101, and the bonding layer region 111 is a region in which the semiconductor thin film 103 is crystal-grown on the bonding layer 102. The semiconductor thin film 103 of the bonding layer region 111 and the semiconductor thin film 103 of the non-bonding layer 112 are simultaneously crystal-grown in the same crystal growth process. Therefore, the semiconductor thin film 103 of the bonding layer region 111 and the semiconductor thin film 103 of the non-bonding layer region 112 are formed on the first substrate 101 as a continuous semiconductor thin film.

In the bonding layer region 111 on the first substrate 101, the semiconductor thin film 103 is bonded to the first substrate 101 through the bonding layer 102 with a weak force having no covalent bonding (for example, a Van der Waals force). On the other hand, in the non-bonding layer region 112 on the first substrate 101, the semiconductor thin film 103 is directly bonded to the first substrate 101 by a stronger bonding force (e.g., a force based on covalent bonding) than the bonding layer region 111. Therefore, even if the film stress of the semiconductor thin film 103 becomes larger than the bonding force of the bonding layer 102, the semiconductor thin film 103 is strongly bonded and fixed to the first substrate 101 in the non-bonding layer region 112, which makes it possible to prevent the semiconductor thin film 103 from being unintentionally peeled off from the first substrate 101 in steps such as a crystal-growing step of the semiconductor thin film 103 or a semiconductor device manufacturing step of processing the semiconductor thin film 103. It should be noted that the non-bonding layer region 112 may be a partial region at any distance from the outer periphery of the first substrate 101, and other various modifications can be applied, although the non-bonding layer region 112 without the bonding layer 102 is the entire region equidistant from the outer periphery of the first substrate 101 in FIGS. 2A to 2C.

Figure 3A:
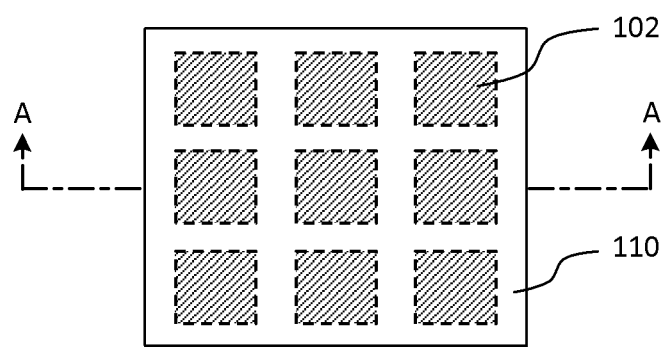
FIGS. 3A and 3B show a variation of a structure of the semiconductor substrate to prevent a semiconductor thin film from being unintentionally peeled off from a first substrate.
Figure 3B:
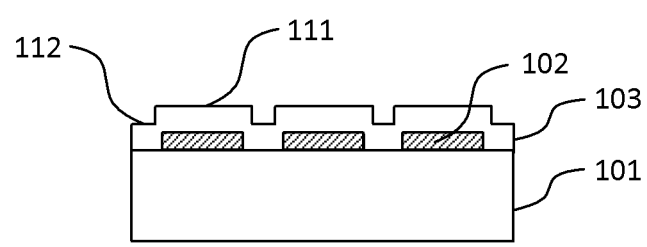

FIGS. 3A and 3B show a variation of the structure of the semiconductor substrate that prevents the semiconductor thin film 103 from being unintentionally peeled off from the first substrate 101. In the structure of the semiconductor substrate shown in FIGS. 3A and 3B, the bonding layer 102 divided into a plurality of regions on the first substrate 101 and the exposed region 110 of the first substrate 101 for dividing the bonding layer 102 are formed.

Shaded regions within broken lines of a top view shown in FIG. 3A are the bonding layer 102, and the other region is the exposed region 110 of the first substrate 101. An A-A line cross section shown in FIG. 3B shows a state in which the semiconductor thin film 103 is formed above the first substrate 101. Even in the variation shown in FIGS. 3A and 3B, the semiconductor thin film 103 formed on the first substrate 101 is bonded to the first substrate 101 with a weak force through the bonding layer 102 in a region where the bonding layer 102 is provided, but the semiconductor thin film 103 is bonded to the first substrate 101 in a region where the first substrate 101 is exposed with a strong force. Therefore, even if the film stress of the semiconductor thin film 103 becomes larger, it is possible to prevent the semiconductor thin film 103 from being unintentionally peeled off from the first substrate 101 in steps such as a crystal-growing step of the semiconductor thin film 103 and a step of manufacturing a semiconductor device in the semiconductor thin film 103.

<A Semiconductor Substrate Having a Fixing Layer 120>

Figure 4A:
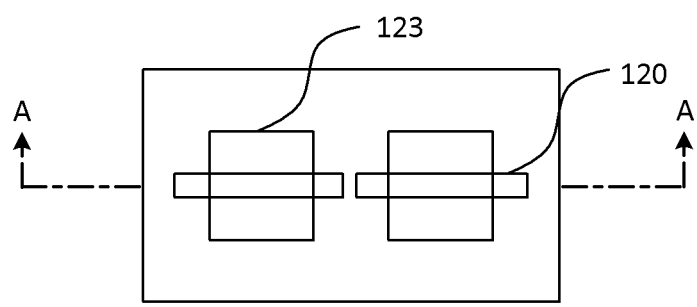
FIGS. 4A and 4B show the structure of the semiconductor substrate in which a plurality of semiconductor thin film layer islands is formed above the first substrate.
Figure 4B:
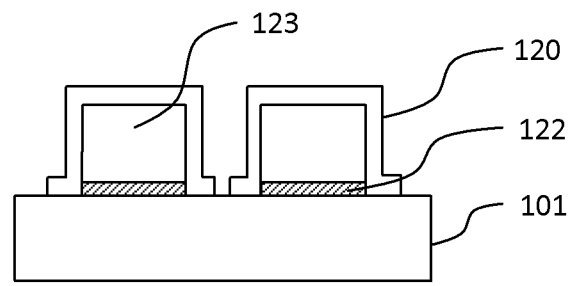

FIGS. 4A and 4B show a structure of a semiconductor substrate 100a in which a plurality of semiconductor thin film islands 123 are formed above a first substrate 101. The bonding layer 122 is formed directly below the semiconductor thin film island 123 in FIGS. 4A and 4B. The semiconductor substrate 100a shown in FIGS. 4A and 4B includes the first substrate 101, the bonding layer 122 formed in a portion of the bonding layer region of the first substrate 101, the semiconductor thin film island 123 formed on the bonding layer 122 formed in the bonding layer region, and a fixing layer 120 extending from the semiconductor thin film island 123 to a non-bonding layer region other than the bonding layer region. The bonding layer 122 bonds the semiconductor thin film island 123 with a force weaker than covalent bonding.

As shown by a top view of FIG. 4A and an A-A line cross-section of FIG. 4B, in the semiconductor substrate 100a, the fixing layer 120 extending from the semiconductor thin film island 123 to the surface of the first substrate 101 is formed after the semiconductor thin film island 123 is formed. The fixing layer 120 is a structure for temporarily fixing the semiconductor thin film island 123 to be separated from the first substrate 101 onto the first substrate 101 until being separated from the first substrate 101. The fixing layer 120 may be formed of, for example, a thin film.

Before forming the fixing layer 120, a region of the bonding layer 122 for fixing the fixing layer 120 onto the first substrate among regions between a plurality of islands 123 is removed when the semiconductor thin film islands 123 are formed by dividing the semiconductor thin film 103 on the first substrate 101. This makes it possible to form the fixing layer 120 on the first substrate. The material of the fixing layer 120 may be an inorganic material such as, $SiO_2$, SiN, $Al_2O_3$, and AlN. The fixing layer 120 may be formed of an organic material.

The fixing layer 120 can be formed by, for example, a plasma CVD, a sputtering method, or the like. For example, the fixing layer 120 can be formed so as to extend from the upper surface of the semiconductor thin film island 123 to a region where the surface of the first substrate 101 is exposed by using a photosensitive organic material.

FIGS. 4A and 4B illustrate a case where the shape of the fixing layer 120 is a shape extending to the left and right from the upper surface of the semiconductor thin film island 123, but it can be appropriately modified. For example, the fixing layer 120 does not need to have a continuous shape on the top surface of the semiconductor thin film island 123, and may cover the entire surface of the semiconductor thin film island 123. Further, the fixing layer 120 may extend from both sides of the semiconductor thin film island 123, each side being perpendicular to the other. The processing of the fixing layer 120 can be realized using a standard photolithography process and an etching process.

Figure 5A:
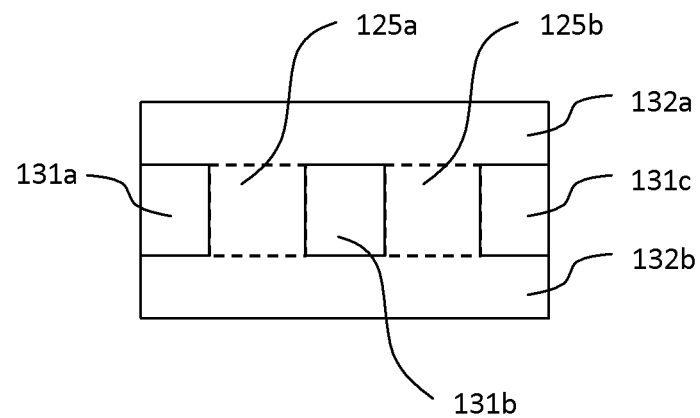
FIGS. 5A to 5C show an exemplary step of processing the semiconductor thin film island.
Figure 5B:
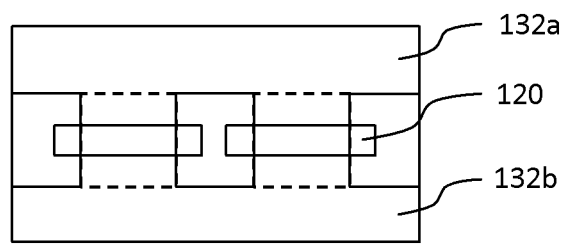
Figure 5C:
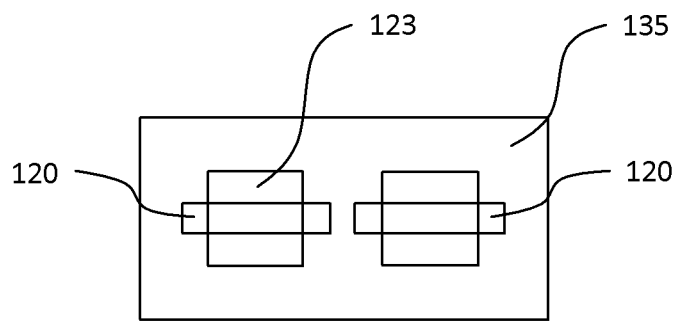

FIGS. 5A to 5C show a step of processing the semiconductor thin film island 123 while preventing the semiconductor thin film bonded to the first substrate 101 through the bonding layer 122 from being unintentionally peeled off from the first substrate 101. Regions 125a and 125b in FIGS. 5A to 5C are regions where the semiconductor thin film islands 123 are to be formed.

First, the semiconductor thin film and the bonding layer 122 are removed in regions 131a, 131b, and 131c of FIGS. 5A to 5C to expose the surface of the first substrate 101 (FIG. 5A). Next, the fixing layers 120 extending from the upper surfaces of the regions 125a and 125b where the semiconductor thin film islands are to be formed to the regions 131a, 131b and 131c of the first substrate 101 are formed (FIG. 5B).

Next, the semiconductor thin film and the bonding layer 122 are removed in the regions 132a and 132b to expose the surface of the first substrate 101 (FIG. 5C). A region 135 in FIG. 5C shows a region where the surface of the first substrate 101 is exposed around the semiconductor thin film islands 123. Processing of the semiconductor thin film islands 123 temporarily fixed by the fixing layer 120 above the first substrate 101 is completed through the above-mentioned steps.

<Method for Transferring a Semiconductor Thin Film to Another Substrate>

Hereinafter, a step of separating the semiconductor thin film island 123 from the first substrate 101 and bonding the separated semiconductor thin film island 123 to the second substrate 201 will be described. FIGS. 6A and 6B and FIGS. 7A to 7D are drawings for explaining a step of bonding the separated semiconductor thin film island 123 to the second substrate 201.

Figure 6A:
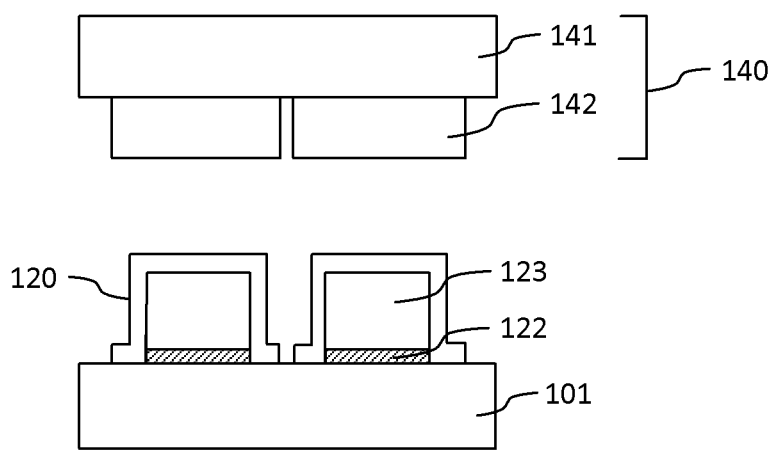
FIGS. 6A and 6B are for explaining a step of bonding the separated semiconductor thin film island to a second substrate.

First, as shown in FIG. 6A, a pick-up substrate 140 is manufactured to separate the semiconductor thin film island 123 from the first substrate 101 and to bond the separated semiconductor thin film island 123 to the second substrate 201. The pick-up substrate 140 includes a third substrate 141 and an organic material bump 142. The organic material bump 142 can be formed in a shape and size suitable for the shape and size of the semiconductor thin film island 123 by, for example, applying a photosensitive organic material to the main surface of the third substrate 141 and using a standard photolithography method. A sheet of a photosensitive material may be used in addition to a photosensitive coating material as an organic material constituting the organic material bump 142.

The organic material bump 142 may be a continuous organic material layer corresponding to an array of the semiconductor thin film islands 123 on the first substrate 101 to be separated from the first substrate 101. In this case, since the organic material bump or the organic material layer can be previously formed on the third substrate 141, the bonding force between the third substrate 141 and the organic material bump or the organic material layer is strong.

The pick-up substrate 140 may have other various configurations. A Si substrate, a glass substrate, a quartz substrate, a ceramic substrate, or a metal substrate, for example, may be used as a material of the third substrate 141 constituting the pick-up substrate 140. In addition, the surface of the third substrate 141 may be coated with a material different from the material of the third substrate 141.

Figure 6B:
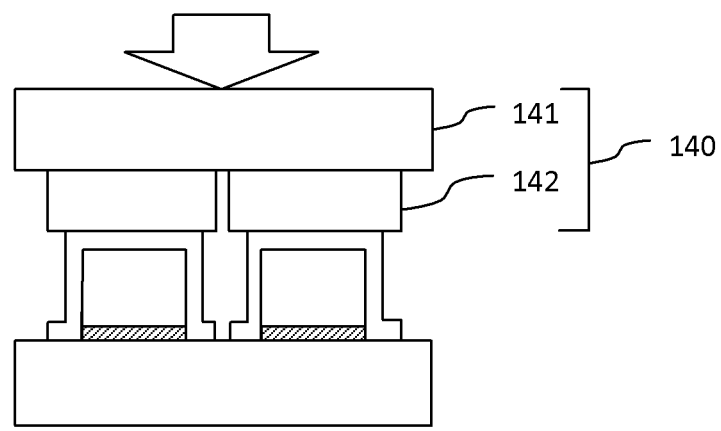

Next, the organic material bump 142 of the pick-up substrate 140 is aligned with the semiconductor thin film island 123 to press the pick-up substrate 140 against the semiconductor thin film island 123. Specifically, the organic material bump 142 is closely adhered to the semiconductor thin film island 123 and the fixing layer 120, thereby bonding the organic material bump 142 to the semiconductor thin film island 123 (FIG. 6B).

Figure 7A:
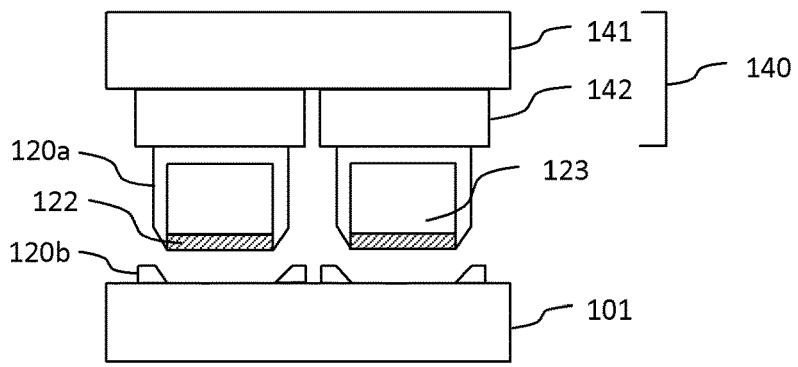
FIGS. 7A to 7D are for explaining a step of bonding the separated semiconductor thin film island to the second substrate.

Subsequently, as shown in FIG. 7A, the pick-up substrate 140 is moved, for example, in a direction separating the semiconductor thin film island 123 from the first substrate 101 (e.g., upward). Since the semiconductor thin film island 123 is bonded to the first substrate 101 with a weak force through the bonding layer 122, the fixing layer 120 is broken in the vicinity of a region that is subjected to movement (that is, a region where a breaking force is concentrated) when the pick-up substrate 140 is moved. That is, a portion of the fixing layer 120 in the vicinity of the bottom of the semiconductor thin film island 123 is broken to become a fixing layer 120a (FIG. 7A). A portion of the fixing layer 120 remains as a fixing layer 120b on the first substrate 101. It should be noted that the fracture shapes of the fixing layer 120 shown in FIG. 7A are only schematically depicted.

Figure 7B:
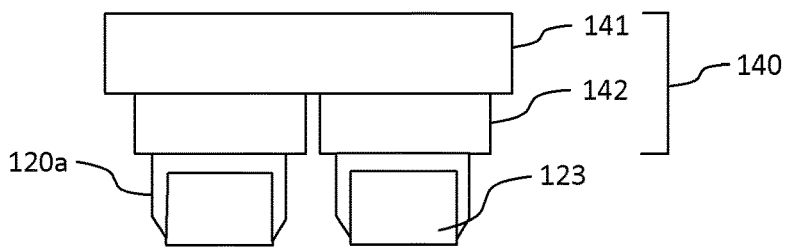

All or a portion of the bonding layer 122 remains on a separation surface of the semiconductor thin film layer island 123 separated from the first substrate 101. When the semiconductor thin film island 123 is bonded to the second substrate 201 with the bonding layer 122 remaining on the separation surface of the semiconductor thin film island 123, there is a risk that the semiconductor thin film island 123 will be unintentionally peeled off from the second substrate 201 since the remaining bonding layer and the second substrate 201 are bonded with a weak force. Therefore, the bonding layer 122 remaining on the separation surface of the semiconductor thin film island 123 may be removed prior to performing a step of bonding the semiconductor thin film island 123 to the second substrate 201 (FIG. 7B). The bonding layer 122 may be removed by performing dry etching (for example, etching using $O_2$ gas).

Figure 7C:
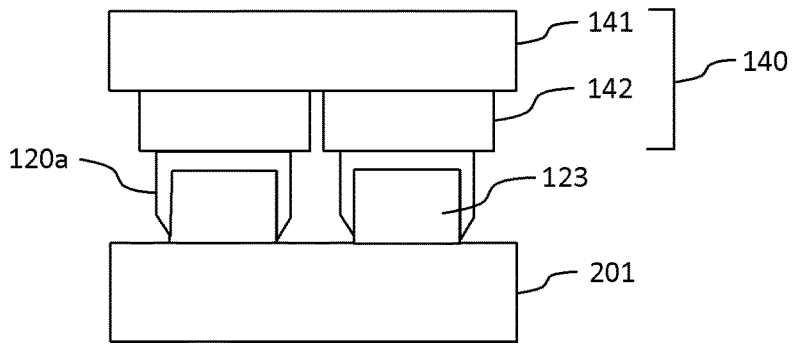

Next, the semiconductor thin film island 123, from which the bonding layer 122 remaining on the semiconductor thin film has been removed, is pressed against the second substrate 201 to bond the semiconductor thin film island 123 to the second substrate 201 (FIG. 7C). The force for bonding the semiconductor thin film island 123 to the second substrate 201 is, for example, an intermolecular force. This bonding force between the semiconductor thin film island 123 and the second substrate 201 is greater than the bonding force (a Van der Waals force) between the semiconductor thin film island 123 and the bonding layer 122.

Prior to a step of bonding the semiconductor thin film island 123 to the second substrate 201, an inorganic film, an organic film, a metal film, or a stacked film thereof may be provided on the surface of the second substrate 201 or a partial region of the surface of the second substrate 201, and the semiconductor thin film island 123 may be bonded thereon. A step of surface-treating the bonding surface may be appropriately performed prior to the above-mentioned bonding step.

Figure 7D:
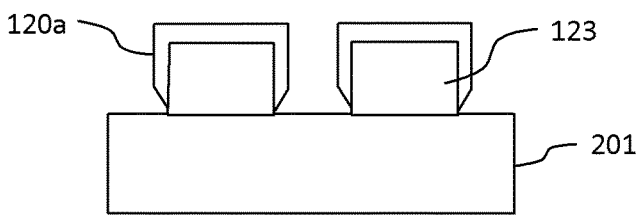

After bonding the semiconductor thin film island 123 to the second substrate 201, the third substrate 141 and the organic material bump 142 are removed from the semiconductor thin film island 123 bonded to the second substrate 201 by immersing the organic material bump 142 in an organic solvent such as acetone to dissolve the organic material bump 142 (FIG. 7D).

<Flowchart of a Step of Transferring the Semiconductor Thin Film Island 123>

Figure 8:
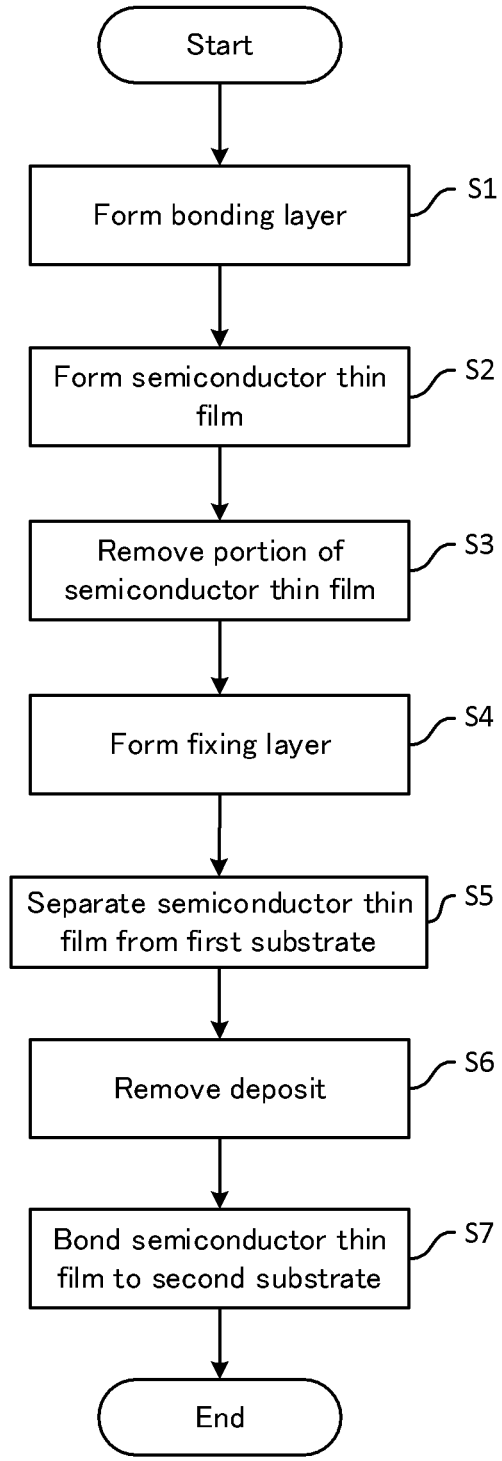
FIG. 8 is a flowchart of a step of separating the semiconductor thin film island from the first substrate and bonding the semiconductor thin film island to the second substrate.

FIG. 8 is a flowchart of a step of separating the semiconductor thin film island 123 formed on the first substrate 101 through the bonding layer 122 from the first substrate 101 of the semiconductor substrate 100a shown in FIGS. 4A and 4B and bonding the separated semiconductor thin film island 123 to the second substrate 201.

First, a bonding layer forming step is performed to form the bonding layer 102 that bonds the semiconductor thin film 103 to a portion of the bonding layer region of the first substrate 101 with a force weaker than covalent bonding (S1). The bonding layer region is, for example, a region in which the bonding layer 102 in FIGS. 2A to 2C is formed. In the bonding layer forming step, the bonding layer 102, where a material containing carbon atoms is exposed, is formed. The material containing carbon atoms is, for example, graphene.

In the bonding layer forming step, the bonding layer 102 is formed, for example, so that the area of the bonding layer region is larger than the area of the non-bonding layer region. Specifically, the bonding layer forming step includes a step of forming the bonding layer 102 in the bonding layer region and the non-bonding layer region and a step of removing the bonding layer 102 formed in the non-bonding layer region after forming the bonding layer 102. As a result, the bonding layer 102 is formed in a partial region of the first substrate 101, and so the bonding layer 102 is not formed in other parts of the region.

Next, a thin film forming step of forming the semiconductor thin film 103 in the bonding layer region and the non-bonding layer region other than the bonding layer region is performed (S2). In the thin film forming step, the semiconductor thin film 103 including a semiconductor selected from, for example, a nitride semiconductor, a group III-V compound semiconductor, a semiconductor including Si, and an oxide semiconductor is formed.

Next, a thin film removing step of removing a portion of the semiconductor thin film 103 is performed (S3). In the thin film removing step, the semiconductor thin film 103 formed in the non-bonding layer region is removed, for example. Next, a fixing layer forming step of forming the fixing layer 120 extending from the semiconductor thin film 103 to a region where the semiconductor thin film 103 is removed is performed (S4). In the fixing layer forming step, for example, the fixing layer 120 extending from the semiconductor thin film 103 to the non-bonding layer region is formed.

Next, a separating step of separating the semiconductor thin film 103 from the first substrate 101 is performed by bonding the organic material bump 142, which is an organic material layer included in the pick-up substrate 140 that is a separation substrate different from the first substrate 101, to the semiconductor thin film 103 (S5). In the separating step, the fixing layer 120 is cut off by moving the pick-up substrate 140 away from the first substrate 101.

Subsequently, after performing a deposit removing step of removing the bonding layer 102 adhered to the peeled surface of the semiconductor thin film 103 separated from the first substrate 101 (S6), a bonding step of bonding the semiconductor thin film 103 to the second substrate 201, which is different from the first substrate 101, is performed (S7).

It should be noted that, between the thin film forming step and the fixing layer forming step, a step of dividing the semiconductor thin film 103 into a plurality of islands 123 may further be included as shown in FIGS. 4A and 4B, by forming a groove in the semiconductor thin film 103 formed on the bonding layer 102. In this case, in the bonding layer forming step, the bonding layer 102 included in at least a partial region in which the groove is formed is removed.

The fixing layer 120 is formed in the above description, but the semiconductor thin film 103 may be separated from the first substrate 101 by the pick-up substrate 140 after the semiconductor thin film 103 is formed in the bonding layer region and the non-bonding layer region other than the bonding layer region without forming the fixing layer 120.

In the above description, although a step of forming a predetermined semiconductor device structure in the semiconductor thin film 103 has been omitted, the step of forming the predetermined semiconductor device structure (such as operating regions, wiring, and electrodes of the semiconductor device) in the semiconductor thin film may be performed prior to a step of forming the fixing layer 120 on the semiconductor thin film.

In the flowchart shown in FIG. 8, although a step of separating the semiconductor thin film island 123 from the first substrate 101 of the semiconductor substrate 100a shown in FIGS. 4A and 4B has been exemplified, the semiconductor thin film 103 can be separated from the semiconductor substrate 100 shown in FIGS. 2A to 2C by the same step.

Specifically, first, after a bonding layer forming step of forming the bonding layer 102 that bonds the semiconductor thin film 103 to a portion of the bonding layer region 111 of the first substrate 101 with a force weaker than covalent bonding has been performed, a thin film forming step of forming the semiconductor thin film 103 in the bonding layer region 111 and the non-bonding layer region 112 other than the bonding layer region 111 is performed. Next, a separating step of separating the semiconductor thin film 103 from the first substrate 101 is performed by bonding the organic layer included in the pick-up substrate 140 as a separation substrate different from the first substrate 101 to the semiconductor thin film 103. Subsequently, after performing a deposit removal step of removing the bonding layer 102 adhered to the peeled surface of the semiconductor thin film 103 separated from the first substrate 101, a bonding step of bonding the semiconductor thin film 103 to the second substrate 201 different from the first substrate 101 is performed.

In the bonding layer region 111, the semiconductor thin film 103 is bonded to the first substrate 101 with a force weaker than covalent bonding, and in the non-bonding layer region 112, the semiconductor thin film 103 is bonded to the first substrate 101 with a force stronger than the force in the bonding layer region 111. The area of the non-bonding layer region 112 is sufficiently smaller than the area of the bonding layer region 111, which allows the semiconductor thin film 103 to be separated from the first substrate 101 easily by the pick-up substrate 140.

<A Variation of Removing a Portion of the Bonding Layer 122>

Figure 9:
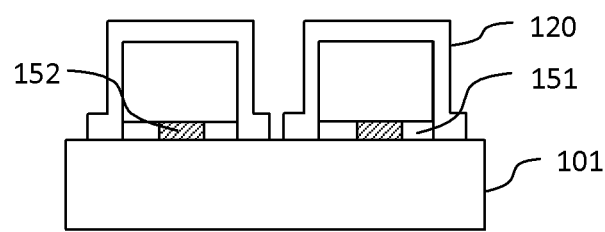
FIG. 9 shows a method for removing at least a partial region of a bonding layer directly below the semiconductor thin film island.

FIG. 9 is a drawing illustrating a method for removing at least a partial region of the bonding layer 122 directly below the semiconductor thin film island 123. For example, a step of removing at least a portion of the bonding layer 122 directly below the semiconductor thin film island 123 may be performed as shown in FIG. 9, prior to bonding the pick-up substrate 140 to the semiconductor thin film island 123. A void 151 in FIG. 9 is a void formed after removing a portion of the bonding layer 122 directly below the semiconducting thin film island 123. A remaining layer 152 is the bonding layer 122 that remains directly below the semiconductor thin film island 123. The bonding layer 122 can be removed by, for example, dry etching using $O_2$ gas.

As shown in FIG. 9, removing at least a portion of the bonding layer 122 directly below the semiconductor thin film island 123 reduces an area where the semiconductor thin film island 123 is bonded to the first substrate 101 through the bonding layer 122. As a result, in a step of separating the semiconductor thin film island 123 from the first substrate 101 with the pick-up substrate 140, the force required for separating the semiconductor thin film island 123 from the first substrate 101 can be reduced.

Figure 10:
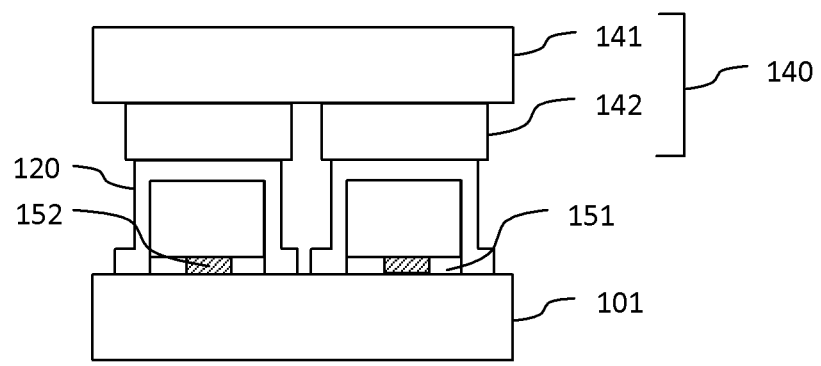
FIG. 10 shows another method of removing at least a partial region of the bonding layer directly below the semiconducting thin film island.

FIG. 10 is a drawing illustrating another method for removing at least a partial region of the bonding layer 122 directly below the semiconducting thin film island 123. As shown in FIG. 10, after bonding the pick-up substrate 140 to the semiconductor thin film island 123, a partial region of the bonding layer 122 can be removed by performing dry etching, for example.

<Effects of the Method for Manufacturing the Semiconductor Device of the Present Embodiment>

According to the method for manufacturing a semiconductor device of the present embodiment, in the semiconductor thin film 103 formed on the first substrate 101 through the bonding layer 102 provided on the first substrate 101, the exposed region 110 where the semiconductor thin film 103 is crystal-grown is provided on at least a partial region of the surface of the first substrate 101. Therefore, the film stress of the semiconductor thin film 103 may become larger due to various conditions such as the material, the layer structure, the layer thickness, and the crystal growth temperature of the semiconductor thin film 103 formed on the first substrate 101. Even if this film stress becomes larger than the bonding force of the semiconductor thin film 103 to be bonded onto the first substrate 101 through the bonding layer 102, it is possible to prevent the semiconductor thin film 103 from being unintentionally peeled off from the first substrate 101 in processes, such as a process of crystal-growing the semiconductor thin film 103, a process of processing the semiconductor thin film 103, and a process of manufacturing the semiconductor device.

Further, according to another method for manufacturing the semiconductor device of the present embodiment, the fixing layer 120 extending from the semiconductor thin film island 123 to the surface of the first substrate 101 is provided. This makes it possible to prevent the semiconductor thin film island 123 from being unintentionally peeled off from the first substrate 101 during steps before separating the semiconductor thin film island 123 from the first substrate 101 even when the film stress of the semiconductor thin film is larger than the bonding force with which the semiconductor thin film island 123 is bonded to the first substrate 101 through the bonding layer 122 due to various conditions such as the material, the layer structure, the layer thickness, and the crystal growth temperature of the semiconductor thin film island 123.

Further, according to the method for manufacturing a semiconductor device of the present embodiment, the semiconductor thin film island 123 can be separated from the first substrate 101 by pressing and bonding the organic material bump 142 capable of easy pattern formation or the pick-up substrate 140 having a continuous organic material layer to the semiconductor thin film island 123. Therefore, an adhesive, an adhesive layer for adhering a support body, or a support body having an adhesive is not required. Furthermore, a jig for picking up the semiconductor thin film island 123 by precision machining or the like is not required to prepare, and so a pick-up substrate 140 having an organic material bump 142 of a shape and size suitable for the shape of the semiconductor thin film islands 123 to be separated from the first substrate 101 can be easily and precisely manufactured.

Further, since the organic material bump 142 or the organic material layer provided on the third substrate 141 can be easily removed from the third substrate 141 using an organic solvent such as acetone, the third substrate 141 constituting the pick-up substrate 140 can be easily reused. That is, it is possible to simplify the process and reduce the necessary members.

Furthermore, a predetermined semiconductor thin film island 123 is selected from the semiconductor thin film islands 123 formed on the first substrate 101, and only the selected semiconductor thin film island 123 is separated from the first substrate 101, and so the separated semiconductor thin film 123 can be bonded to the second substrate 201 with ease.

Further, according to the method for manufacturing a semiconductor device of the present embodiment, a portion of the bonding layer 122 is removed before separating the semiconductor thin film island 123 from the first substrate 101, which effectively reduces the force for separating the semiconductor thin film island 123 from the first substrate 101.

Further, the method for manufacturing a semiconductor device according to the present embodiment includes a step of removing the bonding layer 122 remaining on the separation surface of the semiconductor thin film island 123 separated from the first substrate 101, which makes it possible to obtain a bonding force stronger than a Van der Waals force between the semiconductor thin film island 123 and the second substrate 201. Furthermore, it is possible to reduce the variation among the bonding forces between the individual semiconductor thin film islands 123 and the second substrate 201.

The present invention is explained on the basis of the exemplary embodiments. The technical scope of the present invention is not limited to the scope explained in the above embodiments and it is possible to make various changes and modifications within the scope of the invention. For example, the specific embodiments of the distribution and integration of the apparatus are not limited to the above embodiments, all or part thereof, can be configured with any unit which is functionally or physically dispersed or integrated. Further, new exemplary embodiments generated by arbitrary combinations of them are included in the exemplary embodiments of the present invention. Further, effects of the new exemplary embodiments brought by the combinations also have the effects of the original exemplary embodiments.

The invention claimed is:

1. A method for manufacturing a semiconductor device comprising the steps of:
   forming a bonding layer that bonds a semiconductor thin film to a bonding layer region on a portion of a first substrate with a force weaker than covalent bonding, comprising:
      forming the bonding layer in the bonding layer region and a non-bonding layer region other than the bonding layer region; and
      removing the bonding layer formed in the non-bonding layer region after forming the bonding layer;
   forming the semiconductor thin film in the bonding layer region and the non-bonding layer region;
   separating the semiconductor thin film from the first substrate by bonding an organic layer included in a separation substrate different from the first substrate to the semiconductor thin film;
   before the separating the semiconductor thin film, removing a portion of the semiconductor thin film;
   before the separating the semiconductor thin film, forming a fixing layer extending from the semiconductor thin film to a region where the semiconductor thin film has been removed, comprising:
      forming the fixing layer extending from the semiconductor thin film to the non-bonding layer region;
   removing the bonding layer adhered to a peeled surface of the semiconductor thin film separated from the first substrate; and bonding the semiconductor thin film from which the bonding layer has been removed to a second substrate different from the first substrate.

2. The method for manufacturing a semiconductor device according to claim 1, wherein
the forming the bonding layer includes forming the bonding layer such that an area of the bonding layer region is larger than an area of the non-bonding layer region.

3. The method for manufacturing a semiconductor device according to claim 1, wherein
the removing the portion of the semiconductor thin film includes removing the semiconductor thin film formed in the non-bonding layer region.

4. The method for manufacturing a semiconductor device according to claim 1, further comprising, between the forming the semiconductor thin film and the forming the fixing layer, a step of:
dividing the semiconductor thin film into a plurality of islands by forming a groove in the semiconductor thin film formed on the bonding layer, wherein the forming the bonding layer includes removing the bonding layer included in at least a partial region where the groove is formed.

5. The method for manufacturing a semiconductor device according to claim 1, wherein
the separating the semiconductor thin film includes cutting off the fixing layer by moving the separation substrate away from the first substrate.

6. The method for manufacturing a semiconductor device according to claim 1, wherein
the forming the bonding layer includes forming the bonding layer where a material containing carbon atoms is exposed.

7. The method for manufacturing a semiconductor device according to claim 1, wherein
the forming the semiconductor thin film includes forming the semiconductor thin film containing a semiconductor that is selected from any of a nitride semiconductor, a group III-V compound semiconductor, a semiconductor containing Si, and an oxide semiconductor.

8. The method for manufacturing a semiconductor device according to claim 1, wherein
the forming the bonding layer includes forming the bonding layer having a structure in which layers where carbon atoms are arranged in two dimensions are stacked.

9. A method for manufacturing a semiconductor device comprising the steps of:
forming a bonding layer that bonds a semiconductor thin film to a bonding layer region on a portion of a first substrate with a force weaker than covalent bonding;
forming the semiconductor thin film in the bonding layer region and a non-bonding layer region other than the bonding layer region;
separating the semiconductor thin film from the first substrate by bonding an organic layer included in a separation substrate different from the first substrate to the semiconductor thin film;
before the separating the semiconductor thin film, removing a portion of the semiconductor thin film;
before the separating the semiconductor thin film, forming a fixing layer extending from the semiconductor thin film to a region where the semiconductor thin film has been removed;
between the forming the semiconductor thin film and the forming the fixing layer, dividing the semiconductor thin film into a plurality of islands by forming a groove in the semiconductor thin film formed on the bonding layer, wherein the forming the bonding layer includes removing the bonding layer included in at least a partial region where the groove is formed;
removing the bonding layer adhered to a peeled surface of the semiconductor thin film separated from the first substrate; and
bonding the semiconductor thin film from which the bonding layer has been removed to a second substrate different from the first substrate.

* * * * *